(12) United States Patent
Gruber et al.

(10) Patent No.: US 8,157,158 B2
(45) Date of Patent: Apr. 17, 2012

(54) MODIFICATION OF SOLDER ALLOY COMPOSITIONS TO SUPPRESS INTERFACIAL VOID FORMATION IN SOLDER JOINTS

(75) Inventors: Peter A. Gruber, Mohegan Lake, NY (US); Donald W. Henderson, Ithaca, NY (US); Sung K. Kang, Chappaqua, NY (US); Da-Yuan Shih, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 1161 days.

(21) Appl. No.: 11/669,076

(22) Filed: Jan. 30, 2007

(65) Prior Publication Data

US 2008/0182124 A1    Jul. 31, 2008

(51) Int. Cl.
*B23K 31/00* (2006.01)
(52) U.S. Cl. .................................................. 228/179.1
(58) Field of Classification Search ............... 228/179.1
See application file for complete search history.

(56) References Cited

U.S. PATENT DOCUMENTS

| | | | |
|---|---|---|---|
| 6,264,093 B1 * | 7/2001 | Pilukaitis et al. | 228/180.1 |
| 2002/0015660 A1 * | 2/2002 | Murata et al. | 420/561 |
| 2003/0034381 A1 * | 2/2003 | Nakatsuka et al. | 228/180.1 |
| 2004/0014312 A1 | 1/2004 | Kunishima et al. | |
| 2005/0199679 A1 * | 9/2005 | Nakahara et al. | 228/56.3 |

FOREIGN PATENT DOCUMENTS

JP            01262092 A    * 10/1989

* cited by examiner

*Primary Examiner* — Jessica L Ward
*Assistant Examiner* — Nicholas D'Aniello
(74) *Attorney, Agent, or Firm* — Daniel P. Morris; David Aker

(57) ABSTRACT

A solder joint comprising a solder capture pad on a substrate having a circuit; and a lead containing or a lead free solder selected from the group comprising Sn—Ag—Cu solder, Sn—Cu solder and Sn—Ag solder adhered to the solder capture pad; the solder selected from the group comprising between 0.1 and 6.0 per cent by weight Zn. A solder joint, comprising a solder capture pad on a substrate having a circuit; and a Sn—Cu lead free solder adhered to the solder capture pad, the solder comprising between 0.1 and 6.0% by weight Zn. Formation of voids at an interface between the solder and the solder capture pad is suppressed. A method for forming solder joints using the solders.

12 Claims, 3 Drawing Sheets

SC-0.3Z

MODIFICATION OF SOLDER ALLOY COMPOSITIONS TO SUPPRESS INTERFACIAL VOID FORMATION IN SOLDER JOINTS

BACKGROUND OF THE INVENTION

1. Field of the Invention

The present invention relates to lead containing and lead free solders and methods of forming solder joints using such solders. While it related to solders generally, more particularly, it also relates to solders comprising tin and copper, and solder comprising tin, sliver and copper.

2. Background Art

There has been an extensive search for Pb-free, solder, alloys in recent years. Several promising candidates have been identified for different soldering applications, which include Sn-0.7Cu, Sn-3.5Ag, Sn-3.0Ag-0.5Cu, and Sn-3.5Ag-4.8Bi (in wt.%). It is noteworthy that the compositions of most of the candidate Pb-free solders are Sn-rich solders, typically, 90 wt.% Sn or higher. This suggests that the physical, chemical, and mechanical properties of the proposed Pb-free solders are heavily influenced by the properties of pure Sn, as opposed to eutectic Sn—Pb which consists of mixtures of Sn-rich and Pb-rich phases.

The melting point of most Pb-free, commercial, solders is within the range between 208 and 227° C., which is about 30° C. to 40° C. higher than the melting point Of the Sn—Pb eutectic solder alloy. Reflow temperatures for these alloys are correspondingly higher and this fact has serious implications on the performance of packaging materials and assembly processes and can affect the integrity and/or reliability of Pb-free microelectronic packages.

Among the several Pb-free candidate solders, the near-ternary eutectic Sn—Ag—Cu (SAC) alloys, with a melting temperature of approximately 217° C., are becoming consensus candidates, especially for surface mounted card assembly, including BGA solder joints. Accordingly, extensive research and development activities are currently focused on the Sn—Ag—Cu system to understand the fundamental application issues and to evaluate the reliability risk factors associated with solder joints formed from this alloy family. In addition to the search for Pb-free solder alloys, a proper choice of a solderable layer on a substrate, lead-frame, module, or integrated circuit chip (such as under ball metallurgy (UBM) in a flip chip) is another critical factor affecting the long-term reliability of solder joints through their interfacial reactions. For Pb-free solder joints, the interfacial reactions are known to be more severe than with the eutectic, Sn—Pb, alloy, because of their high Sn content and high reflow temperature. In general, the kinetics of Cu or Ni dissolution in Sn-rich, Pb-free, solder joints is much faster and greater than with eutectic Sn—Pb solder.

Numerous investigations with Pb-free solders have been recently conducted to understand the mechanisms of their interfacial reactions. Several important factors affecting their interfacial reactions were identified, such as solder composition, minor alloying elements, solder volume-to-pad area ratio (the reaction rate will be high when the ratio is high), diffusion barrier layer, solder application method, and reflow condition.

In a previous study, a minor addition of Zn to SAC alloys was found to be effective in controlling the supercooling of the solder alloy below the melting point and, consequently, controlling the formation of large $Ag_3Sn$ plates, as well as in modifying the bulk microstructure and mechanical properties of the alloys.

SUMMARY OF THE INVENTION

It is an object of the invention to provide a solder joint having good mechanical integrity and reliability as a function of thermal aging time at elevated temperatures, such as those that may be realized under field operational conditions.

It is a further object of the invention to provide a solder joint that is void free at the interface between the solder and the pad structure to which it is attached.

It is another object of the invention to provide a method for forming such lead containing solder and lead-free solder joints.

The present invention is based on the discovery that a minor alloying addition of Zn to SAC (or other Pb free solders, or other solders high in tin content, but containing lead) has a dramatic effect on the interfacial, reactive interdiffusion, processes between Sn and the material comprising the pad structures (Cu vs. Ni), during reflow and thermal aging and has a profound effect on the propensity for interfacial void formation, during thermal aging The formation of interfacial voids is undersirable in that it compromises the structural integrity of solder joints when the void densities become high.

These objects and others are achieved in accordance with the invention by a solder joint, comprising a solder capture pad on a substrate having a circuit; and one of a lead containing solder or a lead free solder, the lead free solder being selected from the group comprising Sn—Ag—Cu solder, Sn—Cu solder and Sn—Ag solder adhered to the solder capture pad; the solder selected from the group comprising between 0.1 and 6.0 per cent by weight Zn, so that formation of voids at an interface between the solder and the solder capture pad is suppressed. The optimized Zn content of the solder will depend on the solder volume to pad surface area ratio, among other factors.

The solder can be a Sn—Cu solder, and it can comprise less than 0.5% by weight Bi. The copper content is preferably between 0.7 and 2.0% by weight Cu.

The solder capture pad can be comprised of copper. The solder may be a Sn—Pb solder, and may contain substantially 37% by weight lead.

The invention is also directed to a solder joint, comprising a solder capture pad on a substrate having a circuit; and a Sn—Cu lead free solder adhered to the solder capture pad; the solder comprising between 0.1 and 1.0% by weight Zn, so that formation of voids at an interface between the solder and the solder capture pad is suppressed. The solder can comprise 0.5% by weight Bi. The copper content can be between 0.7 and 2.0% by weight Cu.

Another aspect of the invention is directed to a method for forming a solder joint on a solder capture pad of a substrate having a circuit, comprising applying to the capture pad a lead free solder selected from the group comprising Sn—Ag—Cu solder, Sn—Cu solder and Sn—Ag solder; and adhering the solder to the solder capture pad by melting and cooling the solder; the solder selected from the group comprising between 0.1 and 6.0 per cent by weight Zn, so that formation of voids at an interface between the solder and the solder capture pad is suppressed.

The solder can be Sn—Cu solder, and can further comprise 0.5% by weight Bi. The copper content may be between 0.7 and 2.0% by weight Cu.

The solder can be heated to a temperature of less than 280 degrees C. to melt the solder, and generally between 217 and 280 degrees C. to melt the solder.

The solder capture pad can be comprised of copper. The solder may be a Sn—Pb solder, and may contain substantially 37% by weight lead.

The method can further comprise placing an organic solderability preservative on the solder capture pad, prior to applying the solder to the pad. The method also can further comprise forming a finish on the solder capture pad of a material selected from the group consisting of electroless nickel/Immersion Gold ENIG, Electroless Nickel/Electroless Palladium/Immersion Gold ENEPIG, Direct Immersion Gold (DIG), Immersion Silver I—Ag, Immersion Tin I—Sn and Selective OSP/ENIG, DIG/ENIG.

BRIEF DESCRIPTION OF THE DRAWINGS

The foregoing aspects and other features of the present invention are explained in the following description, taken in connection with the accompanying drawings, wherein.

DETAILED DESCRIPTION OF THE PREFERRED EMBODIMENTS

Figure 2:
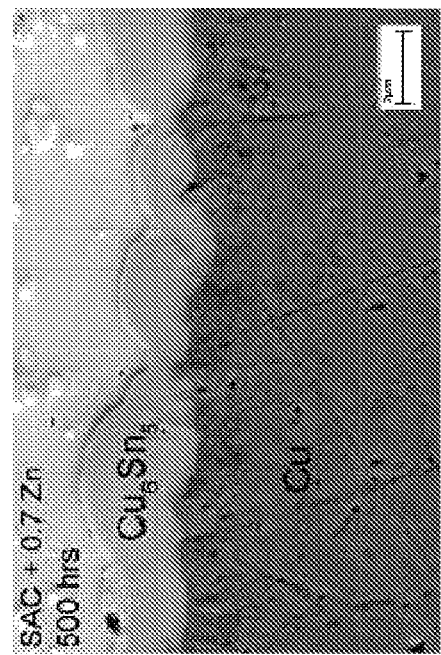
FIG. 2 is a cross-sectional, microscopic, view of an interface between a copper pad and a Sn—Ag—Cu solder ball containing 0.7% wt Zn, and showing suppression of void formation at the interface.

In one embodiment of the invention, bulk ingots or wire of Sn—Cu binary eutectic solder are doped with a small amount (0.1-6.0%) of Zn. During molten solder injection in C4NP wafer bumping process the molten solder will first fill the cavities in the mold then solidify. Solder in filled mold cavities is then aligned and transferred to the wafer, which has ball limiting metallurgy (BLM) pads with a Cu surface, solderable, layer. In addition to Zn a small amount of Bi can be added to the solder to suppress Sn pest. Cu content can be increased to 0.7-2.0% (instead of the eutectic composition of 0.9 wt %) to further reduce Cu consumption to allow thinner sputtered Cu to be used.

In another embodiment and series of experiments, Sn—Ag—Cu solder alloys (in the form of solder balls, about 890 mm in diameter), were commercially produced for a ball grid array (BGA) module assembly. Solder compositions included: Sn-3.8Ag-0.7Cu (SAC), Sn-3.8Ag-0.7Cu-0.1Zn (SAC+0.1Zn) and Sn-3.8Ag-0.7-Cu-0.7Zn (SAC+0.7Zn) (in wt. % with a nominal variation of 0.2 wt. %). The small amount of Zn was added to SAC alloys in a commercial process of producing BGA solder balls. The melting point of the SAC alloys (about 217° C.) was measured by differential scanning calorimetry and was not much affected by the minor additions of Zn.

The microstructures of SAC solder balls both initially and slow cooled (0.02° C./sec) were examined to find any microstructure changes due to the addition of Zn and different cooling rates. To reveal the solder microstructure more clearly, the b-Sn matrix is lightly etched with a diluted etchant of 5% HNO3/3% HCl/92% CH3OH for several seconds. Focused ion-beam (FIB) channeling images are used to record the random orientation of the Sn dendrites and estimate BGA grain orientations by noting contrast reversal when tilting the sample through the [110] Sn dendrite preferential growth direction. The FIB technique is also used to cut a thin slice from solder joint interfaces for high resolution TEM analysis.

Electron probe microanalysis (EPMA) is used to produce x-ray dot maps of the complex Sn—Ag—Cu microstructure to reveal the spatial distribution of fine intermetallic particles (Ag3Sn and Cu6Sn5) in interdendritic regions. Quantitative chemical analysis with the EPMA determines differences in alloy composition as a function of location within a solder joint.

High-resolution TEM analysis combined with energy-dispersive x-ray (EDX) spectroscopy provides useful information about the distribution of Zn atoms near the interfaces and the chemical identification of small particles of intermetallic compounds (less than 1000 nm diameter) below the resolution of EPMA.

The interfacial reactions of SAC+Zn solders were investigated with BGA solder balls attached to a plastic module having Cu or Au/Ni(P) pads. The reflow is performed in a forced convection oven under a N2 atmosphere with the peak temperature ranging from 235 to 245° C. Multiple reflows up to 10 cycles are applied to observe the formation of intermetallic compounds as a function of reflow time. The interfacial reactions of SAC+Zn solders in the solid-state is also investigated with solder joints thermally aged by annealing at 150° C. up to 1000 hr.

Figure 1:
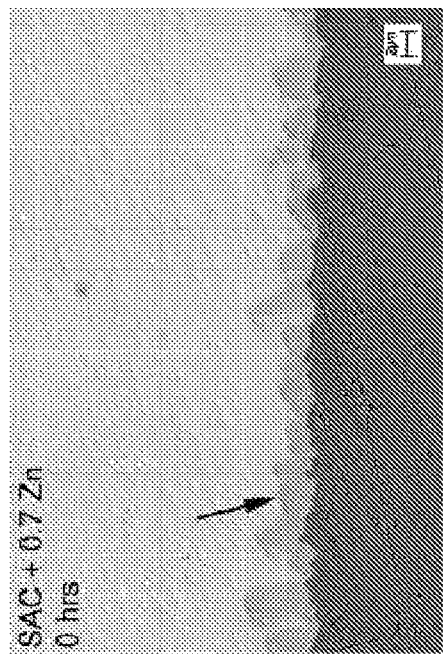
FIG. 1 is a cross-sectional microscopic view of an interface between a copper pad and a SnAgCu solder ball containing no Zn, and showing void formation at the interface.
Figure 1A:
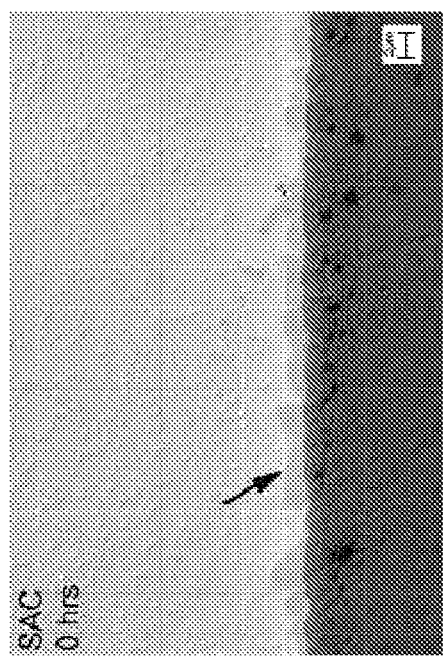
FIG. 1A illustrates the structure of FIG. 1 after annealing (thermal aging) in an accelerated lifetime test.

Referring to FIG. 1 (un-annealed) and to FIG. 1A (annealed), upon an extended annealing of SAC joints in contact with Cu, at 150° C., voids are observed at the interface between Cu and the IMCs. They can grow and coalescence into a void layer as the annealing time increases. This void structure can drastically reduce the joint strength of Pb-free solder joints. At an early stage, the presence of voids is difficult to detect by conventional mechanical testing such as the lap shear or ball shear test, normally conducted at a slow strain rate.

Figure 2A:
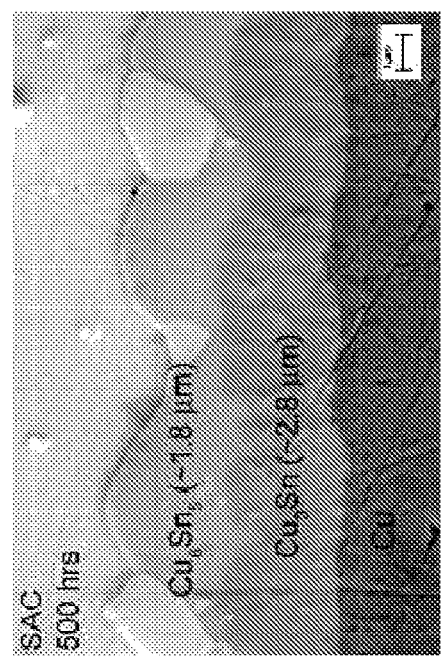
FIG. 2A illustrates the structure of FIG. 2 after annealing in an accelerated lifetime test.

To confirm the void growth in SAC joints during the solid-state annealing, both SAC and SAC+Zn joints on Cu pads are subjected to a long-term annealing at 150° C. for up to 1000 hr. FIGS. 2 and 2A compare the IMC growth in SAC+0.7Zn solder joints with the control samples of SAC annealed at 150° C. (FIGS. 1 and 1A). For 500 hours of annealing, the SAC joint shows two layers of Cu—Sn IMC ($Cu_6Sn_5$ and $Cu_3Sn$) being about equal in thickness. However, for the SAC+0.7Zn joint, the growth of the second, IMC, layer, $Cu_3Sn$, was very much suppressed to a thin layer, probably less than 0.1 um thick. It is believed that retardation of $Cu_3Sn$ IMC growth may be attributed to an accumulation of Zn atoms at the interface between the $Cu_3Sn$ phase and the underlying Cu pad.

Figure 3:
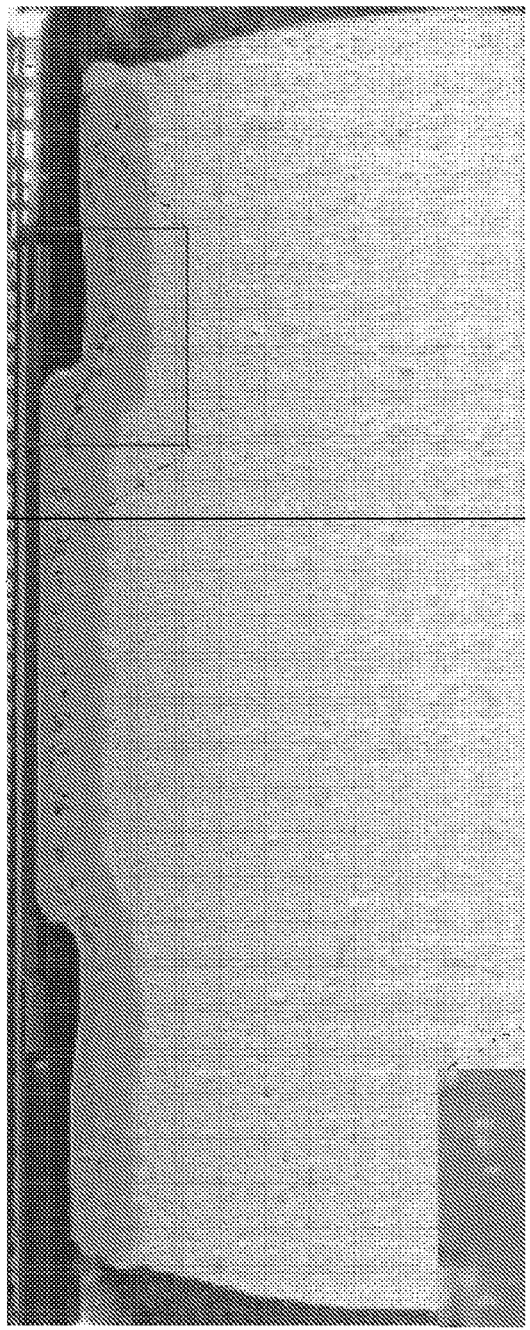
FIG. 3 is a cross-sectional microscopic view of an interface between a copper pad and a Sn—Cu solder ball, the solder containing no Zn, and showing void formation at the interface.
Figure 3A:
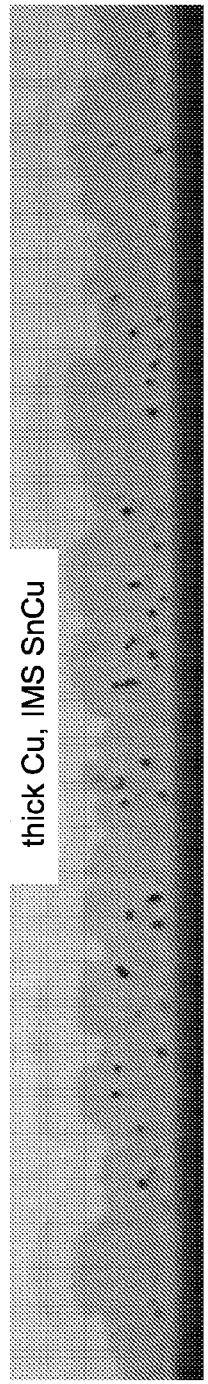
FIG. 3A is an enlarged view of a portion of FIG. 3.

Referring to FIG. 3 and FIG. 3A, very similar issues concerning IMC's and void formation exist for an injection molded SnCu (Sn-0.7Cu) solder ball reflowed on a thick Cu pad.

Figure 4:
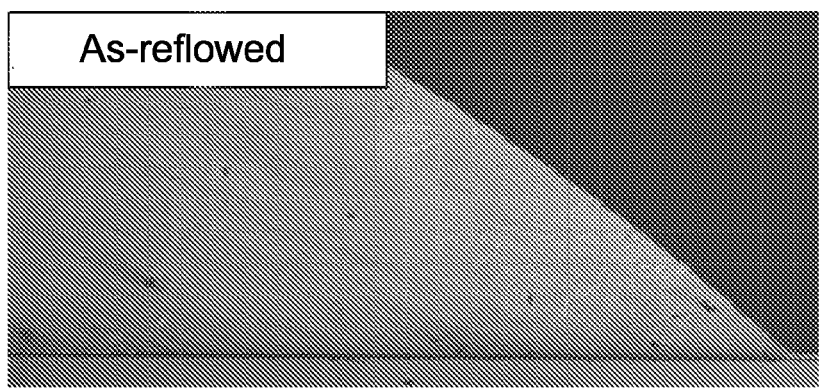
FIGS. 4, 4A and 4B are a cross-sectional microscopic views of an interface between a copper pad and a SnCu solder ball, the solder containing Zn, and showing suppression of void formation at the interface at reflow, after 500 hours of annealing, and after 1,000 hours of annealing, respectively.
Figure 4A:
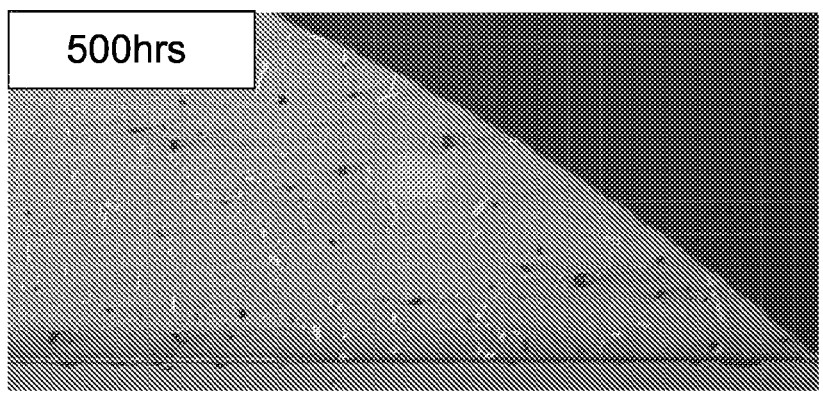
Figure 4B:
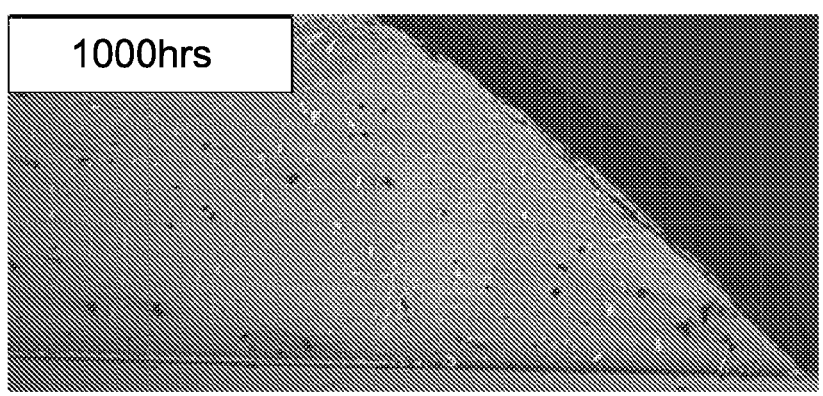

Referring to FIG. 4 the presence of 0.3% wt Zn in the Sn—Cu alloy (Sn-0.7Cu-0.3Zn) solder of FIG. 3 virtually eliminates void formation at reflow. In FIG. 4A, at 500 hours of annealing at a temperature of 150 degrees IMC and void formation are present, but greatly suppressed. This is also the case in FIG. 4B, after 1000 hours of annealing.

In some cases, the linear density of voids at the solder-pad interface may be as high. Densities with more than 1 void per micron have been found, after annealing (thermal aging), without the presence of Zn in the Sn containing solder. Such high void densities inevitably result is extreme mechanical fragility and the loss of solder joint reliability under relatively low mechanical forces. For a similar interface, when Zn is added to the solder, the linear density has been shown to drop as low as one void per 580 microns, after thermal aging. This may have extreme consequences for differences in the service life of the solder joint. Such solder joints maintain their mechanical reliability and are not subject to the early catastrophic failure in mechanical shock or other situations where the solder joint is mechanically loaded.

Thus, the inventors have discovered that in tin rich solders, whether containing lead, or lead free, Zn segregates to the interface and changes the reactive interdiffusion processes, such that, $Cu_3Sn$ is retarded in its development on Cu pad structures. In addition, it appears that there is a very thin, Zn enriched, layer, lying directly between the $Cu_3Sn$ phase and the Cu. As emphasized below, the required levels of Zn needed to effectively suppress void formation are in many cases surprisingly low. The required compositional levels in the solder depend on the solder volume to pad area ratio.

EXAMPLE 1

A 0.025 inch (0.635 mm) diameter solder ball is reflowed on a single 0.022 inch (0.559 mm) diameter Cu pad, voiding is prevented, with only 0.1 wt % Zn in the initial solder ball.

EXAMPLE 2

A solder joint is created with two opposed Cu pads, using a 0.025 inch (0.635 mm) diameter solder ball and 0.022 inch (0.559 mm) diameter pads, some voiding is found with 0.1 wt % Zn present in the initial solder ball. The outcome with one Cu pad and one Ni pad remains undefined for these ball and pad sizes. But, Zn does react at the Ni pad surface. With 0.3 wt % Zn in the solder and the same ball and pad geometry, voiding is prevented with dual Cu pads. Thus, for these typical BGA situations, generally 0.6 or less % wt Zn is more than adequate to suppress void growth.

The important metric in this situation is the ratio of the quantity of available Zn in the solder to the pad surface area. This relationship may be expressed in units of grams of Zn per square micron ($\mu^2$) of pad area. In the case and associated geometry described above, based on the fact that 0.1 wt % Zn is barely adequate for the ball and pad geometry, with a single Cu pad (but not two pads), and ignoring any opposed Ni pad structure, the following relationship is empirically developed:

For the Pb-free high-Sn solders, approximately $4 \times 10^{-12}$ grams of Zn or more are required per $u^2$ of Cu pad surface area, to suppress voiding in high Sn solder joints with Cu pad structures, where the plated Cu is prone to voiding. This ratio is the critical metric to control voiding in the solder joints.

This metric is based on the 0.025 inch (0.635 mm) diameter solder ball and 0.022 inch (0.559 mm) diameter pad case, outlined above.

The metric, above, is applicable to all such solder joints (with adjustment for the possible use of a Ni pad, as the Ni will react with Zn and require an adjustment of the amount of Zn).

Ultimately, the concentration of Zn required to suppress void formation in a high Sn content solder depends upon the solder volume to pad area ratio.

For 0.025 inch (0.635 mm) diameter solder balls and dual 0.022 inch (0.559 mm) diameter pad structures, the compositional level would be approximately 0.2 wt % Zn in the solder. This is a "workable" composition, based on typical reflow processing.

For a 0.003 inch (0.076 mm) diameter C4 bump and dual Cu pad structures, the solder volume to pad area ratio is much different. The volume to surface area ratio is much smaller.

Making adjustment for this surface area to solder volume (for a 0.003 inch (0.076 mm) diameter, C4, bump and dual Cu pad structures, the solder concentration must be much higher) on the order of 3 to 4 wt % Zn in the solder, and in some applications as high as 6 wt %. This concentration in the solder tends to make the alloy much more difficult to process. Areas of non-wetting in a flip chip attachment process can be a significant problem, which may be addressed by revision in the chip join operations, including the use of fluxes suitable for the presence of ZnO.

For a single Cu pad structure with an opposed Ni pad, the above estimate for the Zn concentration in the solder cannot be reduced by substantially one-half. The Ni pad will consume a considerable fraction of the available Zn. Thus, concentrations much higher than 1 wt % Zn are used in the C4 case.

EXAMPLE 3

In the case of high-Sn lead containing solders (such as Sn-37Pb) on Cu-based pad structures, excessive pore formation is far from typical. However, in 5-10% of all Cu pad structures, testing leads to severe voiding in the $Cu_3Sn$ layer. Moreover, extrapolation of accelerated aging results by means of an empirical Arrhenius dependence may be seen to overestimate "life in service" by a factor of 40 or more, under some circumstances. This situation derives from the fact that the growth rate of the voids can be highly variable and the degree of voiding is seen to depend completely on the nature of the Cu pad and has its origins in the plating process used to create the pad structure. Generally, excessive void formation has not been found when high purity, wrought Cu is used. However, under certain conditions it occurs sporadically with plated Cu structures currently supplied to the electronics industry and leads to solder joint fragility. However, voiding may also be significantly reduced by annealing of plated Cu pads at a temperature of approximately 550° C., prior to use in solder joint structures.

It is noted that the presence of lead has no effect on the Sn—Zn interactions with Cu. Thus, the same void suppression effects may be observed in the case of high Sn, lead containing, solders.

The present invention is particularly useful in the C4NP (C4 New Process, as described, for example in U.S. Pat. Nos. 6,149,122 and 6,231,333) process, where it allows accurate compositional control of multi-component solder alloy, injected molten solder can easily incorporate small amount of Zn to suppress void formation at the CuSn interemetallics/Cu layer to allow thick Cu BLM to be used reliably.

It should be understood that the foregoing description is only illustrative of the invention. Various alternatives and modifications can be devised by those skilled in the art without departing from the invention. Accordingly, the present invention is intended to embrace all such alternatives, modifications and variances, which fall within the scope of the appended claims.

What is claimed is:

1. A method for forming a solder joint on a solder capture pad of a substrate having a circuit, comprising:

applying to said capture pad a lead free solder, the lead free solder being selected from the group consisting of Sn—Ag—Cu solder, Sn—Cu solder and Sn—Ag solder; and adhering said solder to said solder capture pad by melting and cooling said solder;

said solder containing between 0.1 and 6.0 percent by weight Zn, so that formation of voids at an interface between said solder and said solder capture pad is suppressed; Zn content of said solder being determined in accordance with a ratio of volume of said solder to surface area of said solder capture pad;

wherein the solder capture pad is comprised of plated Cu, further comprising annealing of the plated Cu pad at a temperature of approximately 550° C., prior to forming the solder joint.

2. The method of claim 1, wherein said selected solder is Sn—Cu solder.

3. The method of claim 2, wherein the solder further comprises 0.5% by weight Bi.

4. The method of claim 3, wherein copper content of said solder is between 0.7 and 2.0% by weight Cu.

5. The method of claim 4, wherein said solder is heated to a temperature of less than 280° C. to melt said solder.

6. The method of claim 4, wherein said solder is heated to a temperature of between 217 and 280 degrees C. to melt said solder.

7. The method of claim 1, wherein said selected solder is Sn—Ag solder.

8. The method of claim 1, further comprising placing an organic solderability preservative on said solder capture pad prior to applying said solder to said pad.

9. The method of claim 1, wherein at least substantially $4 \times 10^{-12}$ grams of Zn are present in said solder per square micron of solder capture pad surface area.

10. The method of claim 1, wherein solder is Sn—Ag—Cu solder containing 0.7 percent by weight Zn and wherein the formation of $Cu_3Sn$ is retarded in its development on the solder capture pad.

11. The method of claim 1, wherein the solder capture pad is comprised of Ni.

12. The method of claim 1, wherein the Zn content of the solder is less than 0.6 percent by weight.

* * * * *